(12) United States Patent
Chen (10) Patent No.: US 9,542,979 B1
(45) Date of Patent: Jan. 10, 2017

(54) MEMORY STRUCTURE (71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/834,475

(22) Filed: Aug. 25, 2015

(51) Int. Cl.
  *G11C 5/02* (2006.01)
  *G11C 8/10* (2006.01)
  *G11C 8/08* (2006.01)

(52) U.S. Cl.
  CPC .............. *G11C 5/025* (2013.01); *G11C 8/08* (2013.01); *G11C 8/10* (2013.01)

(58) Field of Classification Search
  CPC ............. G11C 5/02; G11C 5/025; G11C 8/08; G11C 8/10; H01L 27/0688
  See application file for complete search history.

(56) References Cited

U.S. PATENT DOCUMENTS

| | | | | |
|---|---|---|---|---|
| 6,879,505 B2* | 4/2005 | Scheuerlein | ......... | H01L 27/115 257/E27.103 |
| 7,286,439 B2* | 10/2007 | Fasoli | ..................... | G11C 8/10 365/185.01 |
| 7,335,906 B2* | 2/2008 | Toda | ........................ | G11C 5/02 257/2 |
| 8,729,523 B2* | 5/2014 | Pio | ........................... | H01L 45/16 257/2 |
| 8,787,061 B2* | 7/2014 | Kono | ..................... | G11C 5/025 365/230.06 |
| 8,797,777 B2* | 8/2014 | Hishida | .................. | G11C 5/025 365/185.05 |
| 2014/0160828 A1* | 6/2014 | Park | ........................ | G11C 5/063 365/72 |
| 2014/0198552 A1* | 7/2014 | Park | ........................ | G11C 5/025 365/51 |
| 2015/0060992 A1 | 3/2015 | Taekyung et al. | | |
| 2015/0206898 A1 | 7/2015 | Chen | | |
| 2015/0206899 A1* | 7/2015 | Chen | ................. | H01L 27/11582 257/324 |

FOREIGN PATENT DOCUMENTS

TW  201613152 A  4/2016

OTHER PUBLICATIONS

TIPO Office Action dated Jun. 8, 2016 in Taiwan application (No. 104128657).

* cited by examiner

*Primary Examiner* — Allison P Bernstein
(74) *Attorney, Agent, or Firm* — McClure, Qualey & Rodack, LLP (57) ABSTRACT

A memory structure includes N array regions and N page buffers coupled to the N array regions, respectively. N is an integer ≥2. Each of the N array regions includes a 3D array of a plurality of memory cells. The memory cells have a lateral distance d between two adjacent memory cells on a horizontal cell plane of the 3D array. Each of the N array regions further includes a plurality of conductive lines. The conductive lines are disposed over and coupled to the 3D array. The conductive lines have a pitch p, and p/d=⅕ to ½. The N array regions and the N page buffers are arranged on one line along an extension direction of the conductive lines.

11 Claims, 8 Drawing Sheets

FIG. 7

MEMORY STRUCTURE

TECHNICAL FIELD

This disclosure relates in general to a semiconductor structure, and more particularly to a memory structure.

BACKGROUND

High speed is important for the use of a memory device. To provide a high-speed memory device, particularly a three-dimensional (3D) memory device, one way is increasing the density of bit lines. A higher bit line density is beneficial to parallel operation, and thereby the speed can be increased. At the same time, the number of string select lines can be decreased. Some other advantages, such as reduced read disturbance and reduced power consumption, may be obtained due to the decrease of the string select line number.

However, a higher bit line density means a smaller space between the bit lines, and thereby a higher capacitance (C). In addition, a smaller line width may be needed for forming high-density bit lines, and the resistance (R) may be increased. Both the higher capacitance and the increased resistance are disadvantageous for the RC delay (R*C). The higher capacitance is also disadvantageous for the power consumption ($C*V^2$). Further, in some manufacturing processes, forming high-density bit lines may cause a higher litho-etch process cost.

SUMMARY

In this disclosure, another way to obtain a high-speed memory device is provided. According to this disclosure, an excessively high density of the bit lines is prevented.

According to some embodiments, a memory structure comprises N array regions and N page buffers. N is an integer ≥2. Each of the N array regions comprises a 3D array of a plurality of memory cells. The memory cells have a lateral distance d between two adjacent memory cells on a horizontal cell plane of the 3D array. Each of the N array regions further comprises a plurality of conductive lines. The conductive lines are disposed over and coupled to the 3D array. The conductive lines have a pitch p, and p/d=⅕ to ½. The N page buffers coupled to the N array regions, respectively. The N array regions and the N page buffers are arranged on one line along an extension direction of the conductive lines.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. For clarity of illustration, in most of the figures, only the elements to be discussed are shown, and some portions of these elements may also be omitted.

Figure 1:
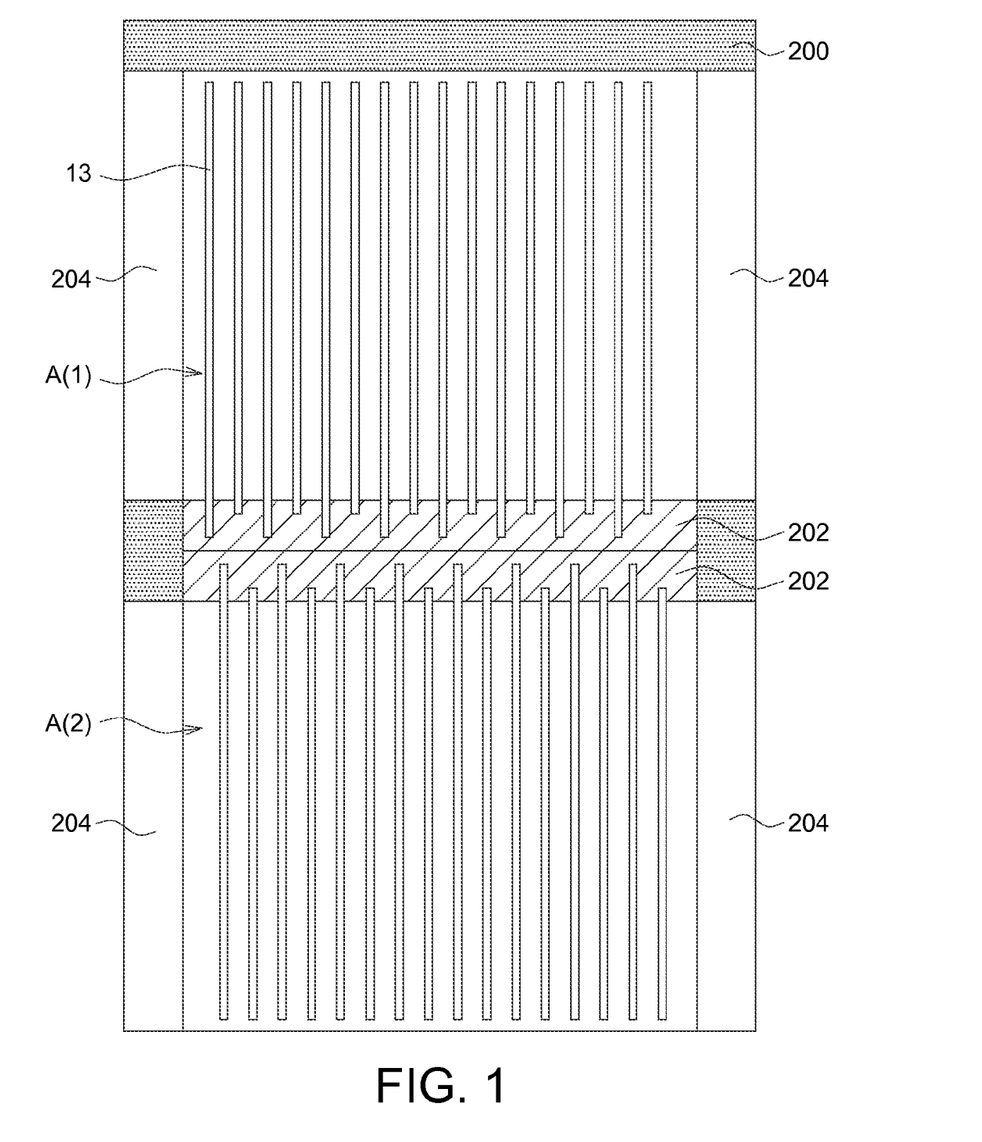
FIG. 1 shows a memory structure according to one embodiment.

Referring to FIG. 1, a memory structure according to one embodiment is shown. For example, the memory structure may be a memory chip 200. The memory structure comprises N array regions A(1) to A(N) and N page buffers 202. N is an integer ≥2. In this embodiment, N=2. Each of the array regions A(1) and A(2) comprises a 3D array of a plurality of memory cells, such as the 3D array 100 shown in FIG. 2A, the detailed description of which is provided later. The memory cells have a lateral distance d (shown in FIGS. 2B and 2C) between two adjacent memory cells on a horizontal cell plane of the 3D array. Each of the array regions A(1) and A(2) further comprises a plurality of conductive lines 13. The conductive lines 13 are disposed over and coupled to the 3D array. The conductive lines 13 have a pitch p (shown in FIGS. 2B and 2C), and p/d=⅕ to ½. In particular, p/d may be ⅕, ¼, ⅓, or ½. The page buffers 202 coupled to the array regions A(1) and A(2), respectively. The array regions A(1) and A(2) and the page buffers 202 are arranged on one line along an extension direction of the conductive lines 13.

Figure 2A:
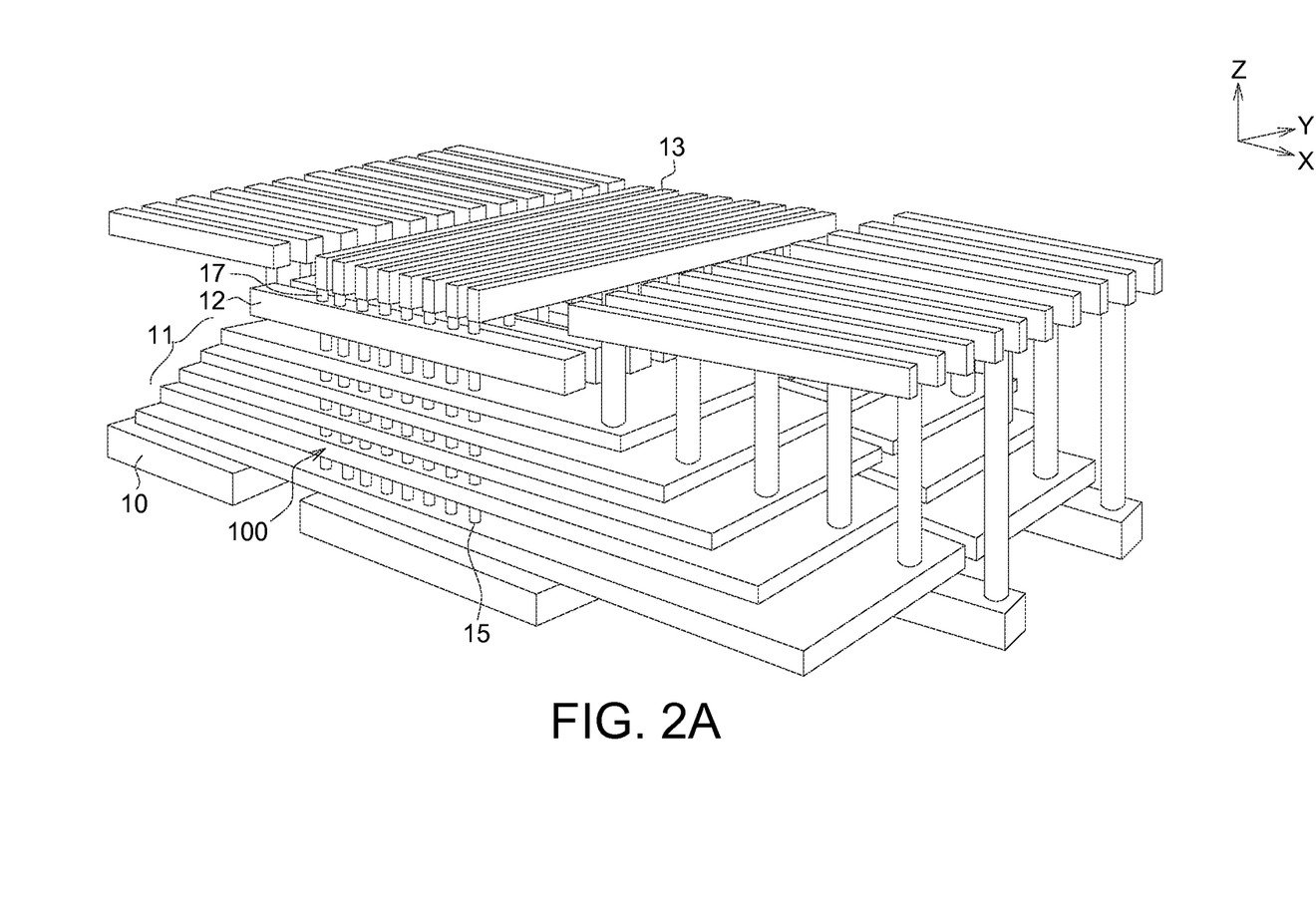
FIG. 2A shows a perspective view of an exemplary array region.

Now referring to FIG. 2A, a perspective view of a typical array region of a 3D NAND memory device is provided. It is noted that this structure is provided only as an example, and other structures may be applied in the array regions A(1) to A(N). In the array region, a multilevel stack of conductive layers 11 are disposed over and parallel to the substrate 10. The conductive layers 11 may be word lines and define blocks of the array region. A plurality of strings 15 penetrate through the conductive layers 11 in a direction orthogonal to the substrate 10. A plurality of memory cells are defined by cross-points between the strings 15 and the conductive layers 11. The memory cells constitute a 3D array 100. A plurality of string select lines 12 are disposed over and parallel to the multilevel stack of the conductive layers 11. Each string select line 12 intersects a row of the strings. A plurality of conductive lines 13 are disposed in parallel over the string select lines 12. The conductive lines 13 may be bit lines. Each of string contacts 17 is disposed correspondingly at each of the strings 15 of the cells, and the string contacts 17 are electrically connected to the corresponding string select lines 12 and the corresponding bit lines. Here, a X-Y plane is defined as a plane parallel to the substrate 10, and a Z-direction is defined orthogonal to the substrate 10. Typically, a X-direction is defined as an extension direction of the word lines, and a Y-direction is defined as an extension direction of the bit lines. Generally, the X-direction may be perpendicular to the Y-direction.

Figure 2B:
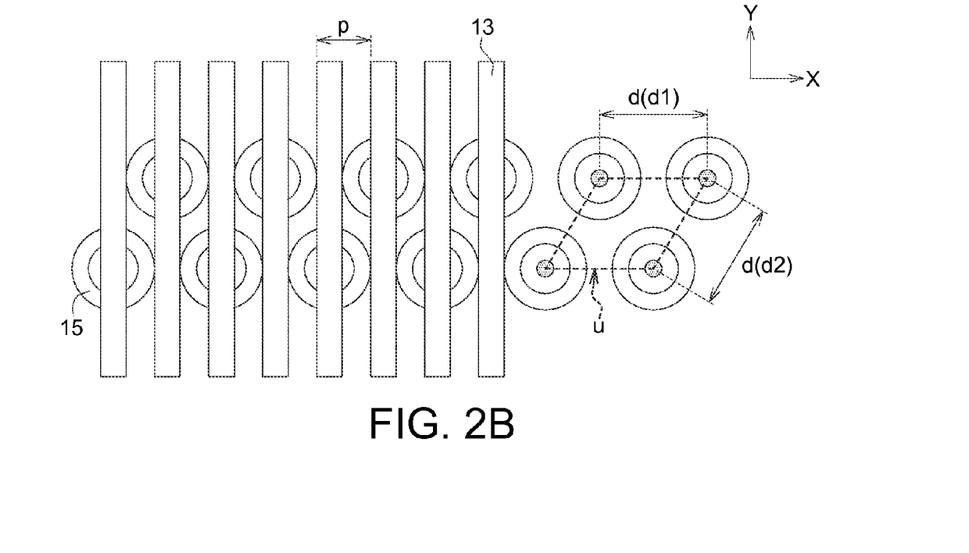
FIG. 2B shows a top view of an exemplary array region.

One arrangement of the conductive lines 13 relative to the strings 15 are illustrated in FIG. 2B through the projections of the conductive lines 13 and the strings 15 on a X-Y plane. On such a X-Y plane, the strings 15, and thereby the memory cells, are disposed in a regular grid. The "unit" u of the regular grid is defined as a parallelogram having a minimum total side length and a minimum area with four vertices located at the centers of four strings 15 of the grid. The lateral distance d of the memory cells on a horizontal cell plane (i.e., the X-Y plane) is defined as a side length of the parallelogram unit u. In some cases, such as the cases that the unit u is square or diamond-shaped, the side lengths of four sides of the unit u are the same. That is, the lateral distance d is a constant. In other cases, the unit u may have two different side lengths. At this time, the lateral distance d1 is different from the lateral distance d2. Here, the lateral distance d1 is defined as the lateral distance d on the direction perpendicular to the extension direction of the conductive lines 13. The conductive lines 13 are disposed over the strings 15 such that two strings 15 on a side of one unit u do not correspond to the same conductive line 13. Due to the 3D array design, the pitch p of the conductive lines 13 is not needed to be the same as d as in the 2D array case. According to embodiments described herein, the pitch p is $d*(1/5)$ to $d*(1/2)$. If the pitch p is lower than $d*(1/5)$, problems caused by the high density of the conductive lines 13 (for example, bit lines) may be emerged. The pitch p of the conductive lines 13 preferably is $d1*(1/5)$ to $d1*(1/2)$. In the embodiment shown in FIG. 2B, the pitch p of the conductive lines 13 is $d*(1/2)$. The pitch p of the conductive lines 13 may be 38 nm to 120 nm.

Figure 2C:
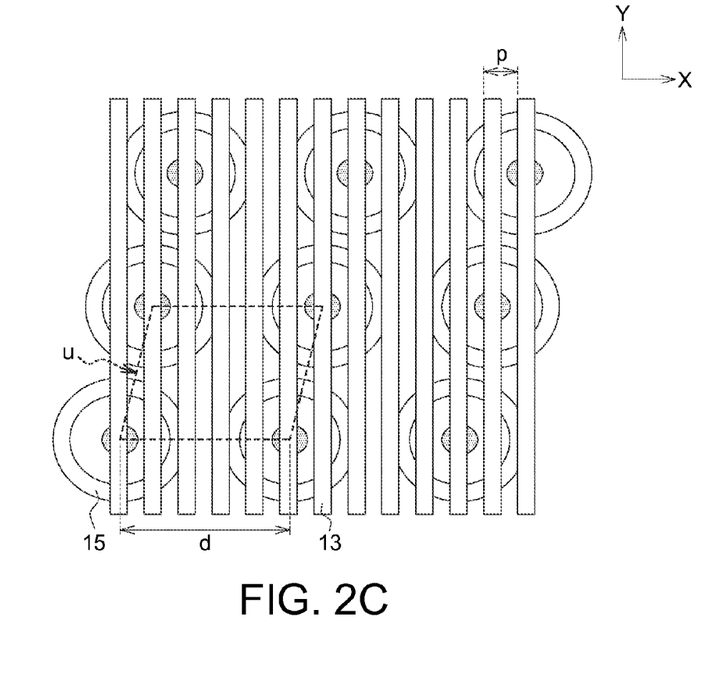
FIG. 2C shows a top view of an exemplary array region.

Another arrangement of the conductive lines 13 relative to the strings 15 are illustrated in FIG. 2C. The difference between FIG. 2C and FIG. 2B is that, in the embodiment shown in FIG. 2C, the pitch p of the conductive lines 13 is $d*(1/5)$.

Referring back to FIG. 1, in most of the embodiments, N is an even number. At this time, the N array regions A(1) to A(N) may comprise a $(2n-1)^{th}$ array region and a $2n^{th}$ array region, wherein n is an integer from 1 to N/2. Here, for ease of understanding, the first array region A(1) and the second array region A(2) are used to illustrate the $(2n-1)^{th}$ array region and the $2n^{th}$ array region, respectively. In other words, the case that N=2 and n=1 is discussed here. The first array region A(1) and the second array region A(2) may be spatially separated from each other. For example, as shown in FIG. 1, the first array region A(1) and the second array region A(2) may be spatially separated from each other by two page buffers 202, which are coupled to the first array region A(1) and the second array region A(2), respectively. According to one embodiment, the first array region A(1) and the second array region A(2) are disposed substantially in a mirror way. In this case, the conductive lines 13 are not disposed in a mirror way. The conductive lines 13 of the first array region A(1) and the conductive lines 13 of the second array region A(2) are preferably misaligned to provide simpler design rule.

The memory structure may further comprise at least N decoders 204, such as word line decoders. Each of the at least N decoders 204 is disposed adjacent to corresponding one of the N array regions A(1) to A(N) in a direction perpendicular to the extension direction of the conductive lines 13, and coupled to the corresponding one of the N array regions A(1) to A(N). In one embodiment, a number of the at least N decoders 204 is 2N, and every two of the 2N decoders 204 are disposed on two sides of the corresponding one of the N array regions A(1) to A(N) in the direction perpendicular to the extension direction of the conductive lines 13. For example, as shown in FIG. 1, two decoders 204 are disposed on two sides of the corresponding array region A(1), and the other two decoders 204 are disposed on two sides of the corresponding array region A(2).

The above description is provided from a structural viewpoint. While from an electrical viewpoint, the memory structure may be a multi-plane memory chip 200. It is noted that the term "plane" used here should not be understood in a spatial manner, but should be understood in an electrical manner. More specifically, the memory structure may comprise N planes, wherein the N planes comprises the N array regions A(1) to A(N), respectively. Compared to a single plane design, the conductive lines 13 in the planes disposed along the extension direction of the conductive lines 13 can have shorter lengths and a lower density. As such, both the capacitance and the resistance of the conductive lines 13 may be decreased, and thereby the RC delay can be decreased. Further, a larger page buffer can be provided. Still further, due to less loading of the conductive lines 13, lower power consumption can be provided. In addition, when the multi-plane design is applied, some means may be used to reduce the overhead time. For example, a first command address is sent firstly, and a first data will be read. During waiting the first data, a second command address may be sent. As such, the time is saved.

Specifically, according to some embodiments, M array regions of the N array regions A(1) to A(N), while be spatially separated, may be configured to operate simultaneously, wherein M is an integer, and M/N is ½ or 1. In other words, a word line address may be separated into M planes of the N planes, M is an integer, and M/N is ½ or 1. To achieve this, connecting all corresponding sets of the word lines in the M array regions is unpractical. Some means to achieve this goal will be provided in following paragraphs with reference to FIGS. 3 and 4. Compared to connecting all corresponding sets of the word lines in the M array regions, the number of connections needed in the means provided here is much less, such as reduced by one order to two orders.

Figure 3:
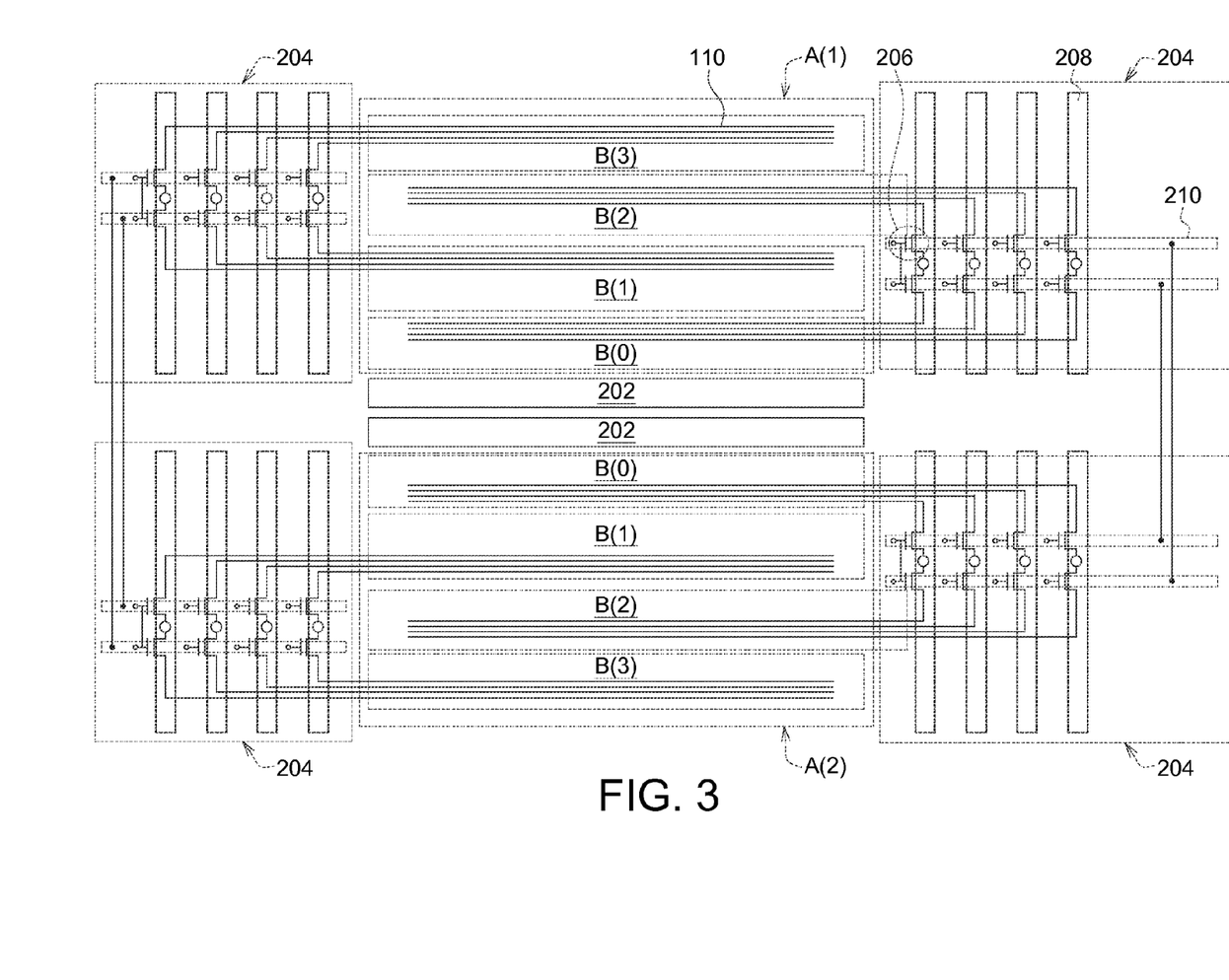
FIG. 3 shows an exemplary memory structure with a coupling configuration.

As shown in FIG. 3, each of the array regions A(1) and A(2) comprises a plurality of blocks. Here, four blocks B(0) to B(3) are exemplarily shown in each array region. Each block comprises a plurality of word lines WL. These word lines WL are connected to corresponding global word lines 208 through a plurality of word line drivers 206, respectively. The word line drivers 206 may be high voltage MOS transistors. The word line drivers 206 corresponding to one block have a common gate 210. In other words, each block corresponds to a common gate 210 of a plurality of word line drivers 206 for a plurality of word lines WL of the block. The first array region A(1) and the second array region A(2) are disposed substantially in a mirror way. A set of M blocks is defined as a set of M blocks belonging to the M array regions, respectively. For example, a set of two blocks, such as two blocks B(2), belong to the two array regions A(1) and A(2), respectively. According to the embodiment shown in FIG. 3, the set of the two blocks (such as the two blocks B(2)) may be coupled by a connection of the common gates 210 of the set of the two blocks. As such, the same word line address can be provided to the M blocks. However, it is noted that the bit line addresses will be different.

Figure 4:
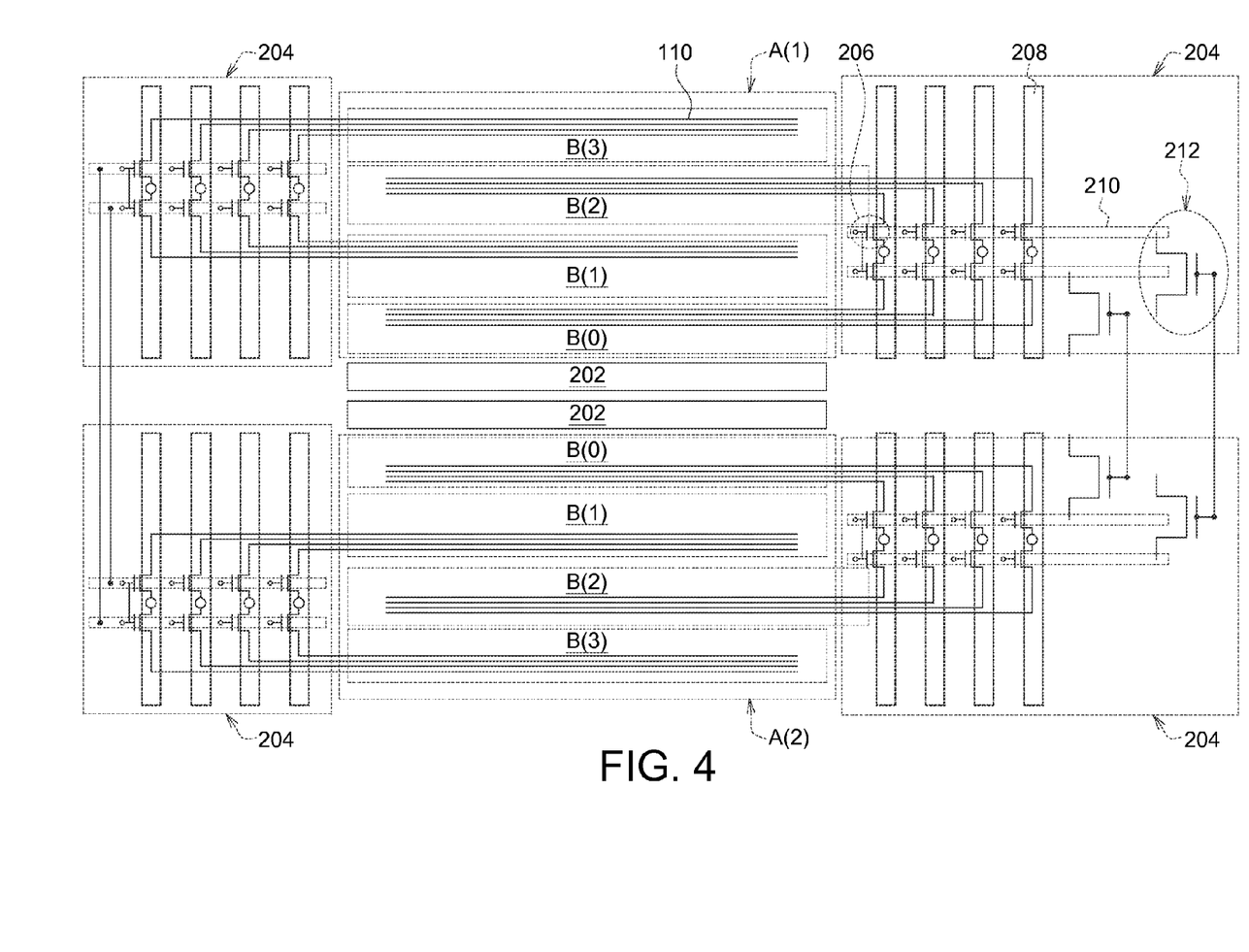
FIG. 4 shows an exemplary memory structure with another coupling configuration.

Another coupling configuration is provided in FIG. 4, which has a similar arrangement as FIG. 3. The difference between FIG. 4 and FIG. 3 is that, in the embodiment shown in FIG. 4, the set of the M blocks are coupled by a connection of control gates 212 of the common gates 210 of the set of M blocks.

Figure 5:
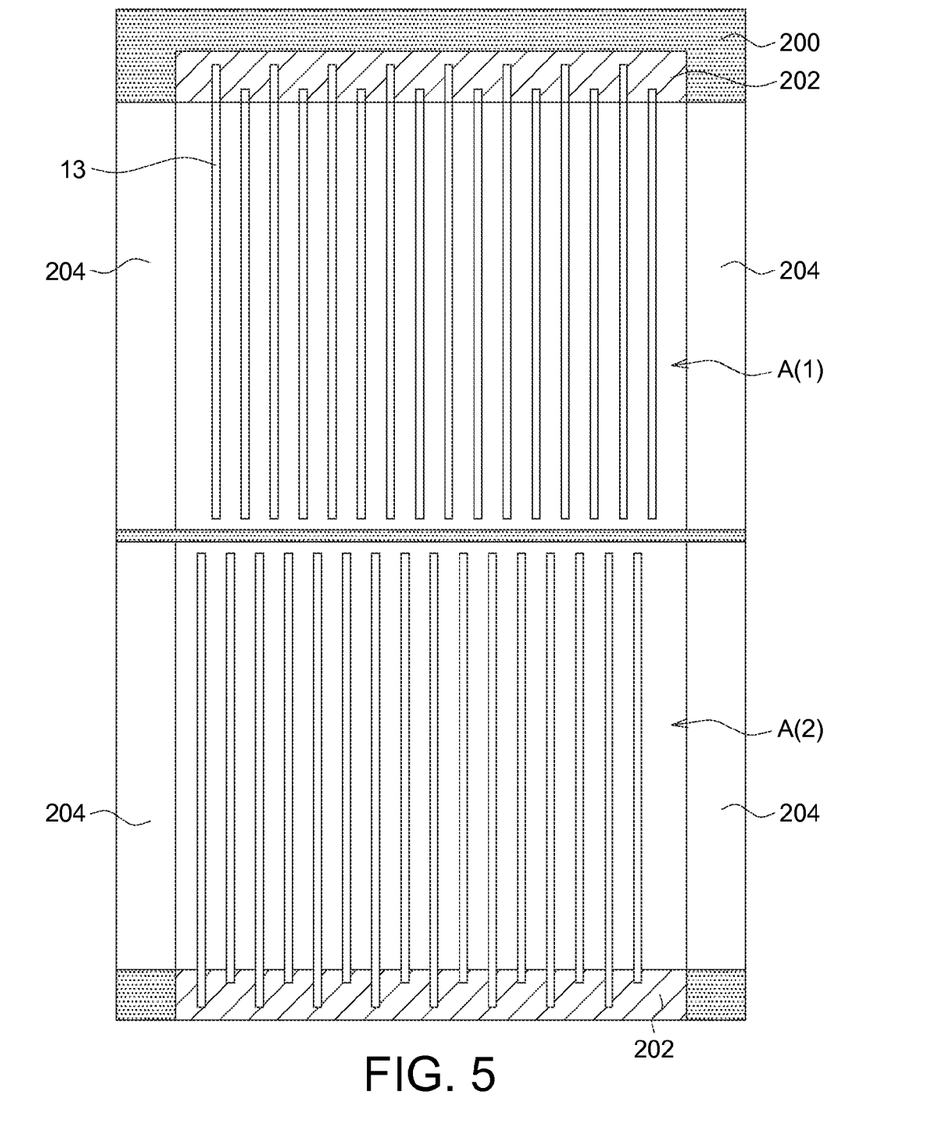
FIG. 5 shows a memory structure according to one embodiment.

Referring to FIG. 5, a memory structure according to another embodiment is shown. FIG. 5 is different from FIG.

1 in the positions of the page buffers 202. In this embodiment, while being spatially separated, the array region A(1) is disposed adjacent to the array region A(2) at one side. The page buffer 202 for the array region A(1) is disposed at the opposite side, i.e., the outer side the array region A(1).

Figure 6:
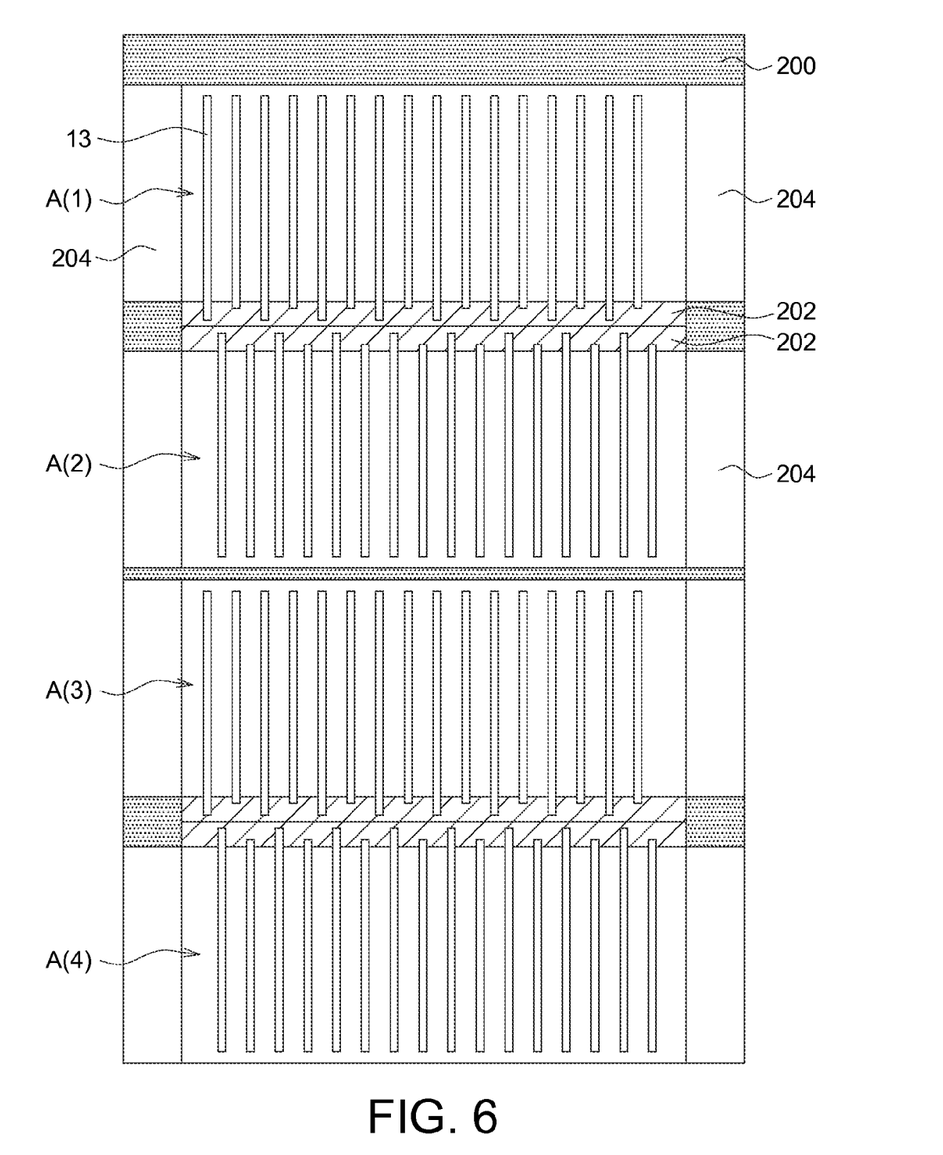
FIG. 6 shows a memory structure according to one embodiment.
Figure 7:
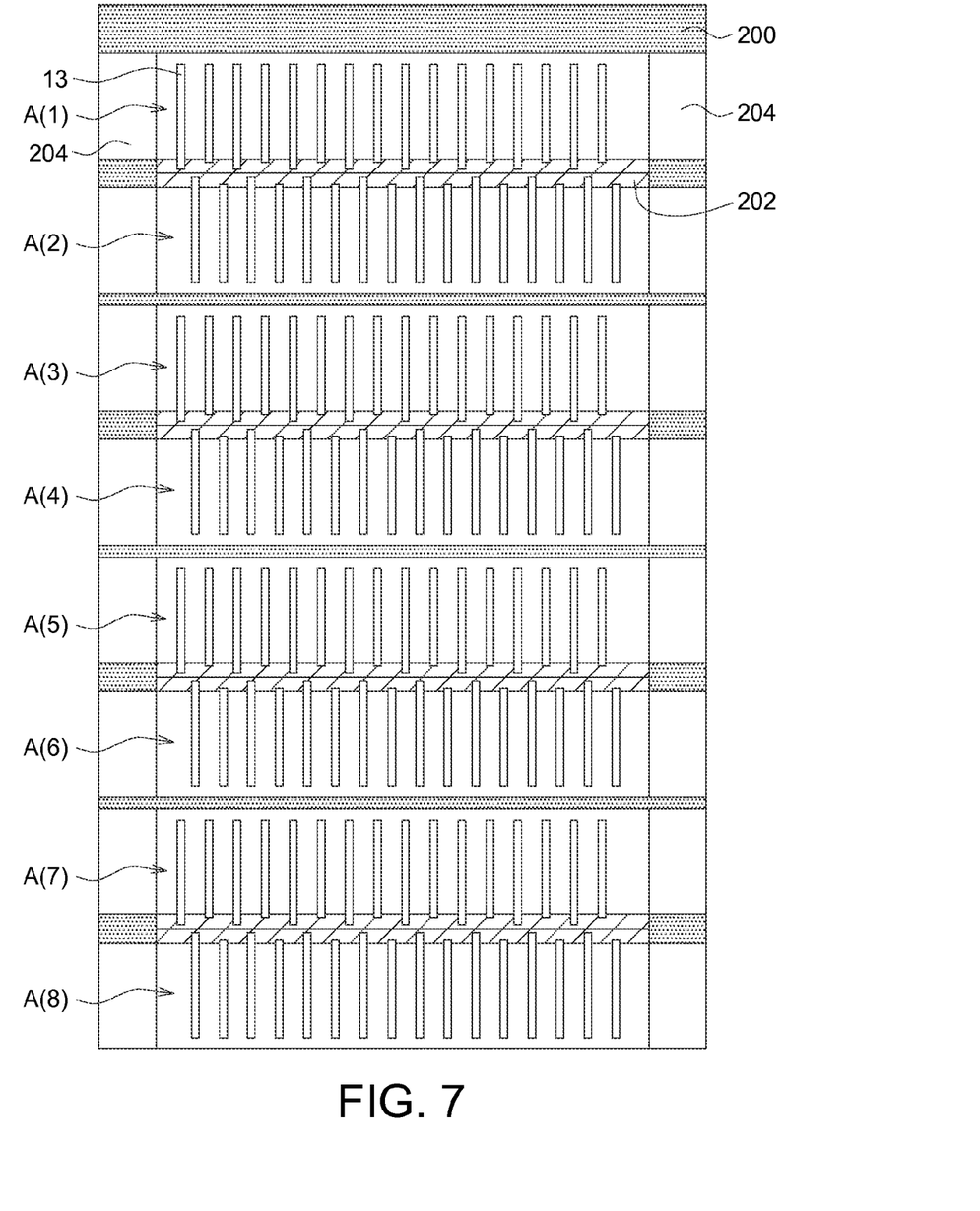
FIG. 7 shows a memory structure according to one embodiment.

FIG. 6 and FIG. 7 show memory structures according to still other embodiments. In the embodiment shown in FIG. 6, the memory structure comprises four array regions A(1) to A(4), i.e., N=4. In the embodiment shown in FIG. 7, the memory structure comprises eight array regions A(1) to A(8), i.e., N=8. Other aspects, details and features have been described above can also be provided for the two embodiments.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory structure, comprising:
N array regions, wherein N is an integer ≥2, and each of the N array regions comprises:
a 3D array of a plurality of memory cells, wherein the memory cells have a lateral distance d between two adjacent memory cells on a horizontal cell plane of the 3D array; and
a plurality of conductive lines disposed over and coupled to the 3D array, wherein the conductive lines have a pitch p, and p/d=1/5 to 1/2; and
N page buffers coupled to the N array regions, respectively;
wherein the N array regions and the N page buffers are arranged on one line along an extension direction of the conductive lines;
wherein N is an even number, and wherein the N array regions comprise a $(2n-1)^{th}$ array region and a $2n^{th}$ array region, and n is an integer from 1 to N/2; and
wherein the conductive lines of the $(2n-1)^{th}$ array region and the conductive lines of the $2n^{th}$ array region are misaligned.

2. The memory structure according to claim 1, wherein p/d=1/5, 1/4, 1/3, or 1/2.

3. The memory structure according to claim 1, wherein p is 38 nm to 120 nm.

4. The memory structure according to claim 1, further comprising:
at least N decoders, wherein each of the at least N decoders is disposed adjacent to corresponding one of the N array regions in a direction perpendicular to the extension direction of the conductive lines and coupled to the corresponding one of the N array regions.

5. The memory structure according to claim 4, wherein a number of the at least N decoders is 2N, and every two of the 2N decoders are disposed on two sides of the corresponding one of the N array regions in the direction perpendicular to the extension direction of the conductive lines.

6. The memory structure according to claim 1, wherein the $(2n-1)^{th}$ array region and the $2n^{th}$ array region are spatially separated from each other by two of the N page buffers, which are coupled to the $(2n-1)^{th}$ array region and the $2n^{th}$ array region, respectively.

7. The memory structure according to claim 1, wherein the conductive lines are bit lines.

8. The memory structure according to claim 7, wherein M array regions of the N array regions are configured to operate simultaneously, M is an integer, and M/N=1/2 or 1.

9. The memory structure according to claim 8, wherein each of the M array regions comprises a plurality of blocks, and each of the blocks corresponds to a common gate of a plurality of word line drivers for a plurality of word lines of the each of the blocks; and
wherein a set of M blocks, which belong to the M array regions, respectively, are coupled by a connection of the common gates of the set of M blocks.

10. The memory structure according to claim 8, wherein each of the M array regions comprises a plurality of blocks, and each of the blocks corresponds to a common gate of a plurality of word line drivers for a plurality of word lines of the each of the blocks; and
wherein a set of M blocks, which belong to the M array regions, respectively, are coupled by a connection of control gates of the common gates of the set of M blocks.

11. The memory structure according to claim 7, comprising N planes,
wherein the N planes comprises the N array regions, respectively, and
wherein a word line address is separated into M planes of the N planes, M is an integer, and M/N=1/2 or 1.

* * * * *